US011337335B1

(12) United States Patent
Lin et al.

(10) Patent No.: US 11,337,335 B1
(45) Date of Patent: May 17, 2022

(54) ACTIVE COOLANT DISTRIBUTION DEVICE AND ELECTRONIC APPARATUS HAVING THE SAME

(71) Applicant: WISTRON CORP., New Taipei (TW)

(72) Inventors: Sheng Yen Lin, New Taipei (TW); Hua Chen, New Taipei (TW); Chuan-Yi Liang, New Taipei (TW)

(73) Assignee: WISTRON CORP., New Taipei (TW)

( * ) Notice: Subject to any disclaimer, the term of this patent is extended or adjusted under 35 U.S.C. 154(b) by 0 days.

(21) Appl. No.: 17/146,514

(22) Filed: Jan. 12, 2021

(30) Foreign Application Priority Data

Nov. 18, 2020 (TW) .................................. 109140372

(51) Int. Cl.
*H05K 7/20* (2006.01)

(52) U.S. Cl.
CPC .................. *H05K 7/20272* (2013.01)

(58) Field of Classification Search
CPC ........... H05K 7/20772; H05K 7/20327; H05K 7/20272; H05K 7/20254; H05K 7/20809; H05K 7/20763; H05K 7/20263; H05K 7/20309; H05K 7/20509; H05K 7/20727; H05K 7/20645; H05K 7/20745; H05K 7/20781; H05K 7/1485; H01L 23/473; H01L 23/467; H01L 35/30; H01L 23/4735

See application file for complete search history.

(56) References Cited

U.S. PATENT DOCUMENTS

| 5,240,068 A * | 8/1993 | Tokutake ................ F28F 9/002 165/67 |
| 2011/0088883 A1* | 4/2011 | de la Cruz .......... F28D 1/05391 165/173 |
| 2013/0271918 A1* | 10/2013 | Neville Hughes .......................... H05K 7/20309 361/702 |
| 2017/0055370 A1* | 2/2017 | Tsai .................... H05K 7/20272 |
| 2017/0112018 A1* | 4/2017 | Krivonak ........... H05K 7/20263 |
| 2018/0177079 A1* | 6/2018 | Nakagawa ......... H05K 7/20781 |
| 2020/0292253 A1* | 9/2020 | Chen .................. H05K 7/20781 |

* cited by examiner

*Primary Examiner* — Adam B Dravininkas
(74) *Attorney, Agent, or Firm* — McClure, Qualey & Rodack, LLP

(57) ABSTRACT

The disclosed embodiments relate to an active coolant distribution device and an electronic apparatus, where the active coolant distribution device includes a manifold including a first and second primary pipes and branches. At least one of the first and second primary pipes is suitable for accommodating the flow generator. The second primary pipe includes a first hollow post and a first and second inner wall portions. The first hollow post has first liquid inlets. The first and second inner wall portions form a first channel, a second channel, and an accommodation space inside the first hollow post. The first inner wall portion has converging port, the second inner wall portion has ejecting port, the first channel is located between the first liquid inlets and the converging port and connected to the accommodation space, the ejecting port is connected to the accommodation space and the second channel.

17 Claims, 10 Drawing Sheets

ACTIVE COOLANT DISTRIBUTION DEVICE AND ELECTRONIC APPARATUS HAVING THE SAME

CROSS-REFERENCE TO RELATED APPLICATIONS

This non-provisional application claims priority under 35 U.S.C. § 119(a) on Patent Application No(s). 109140372 filed in Taiwan (R.O.C.) on Nov. 18, 2020, the entire contents of which are hereby incorporated by reference.

TECHNICAL FIELD

The disclosure relates to the field of heat dissipation, more particularly to an active coolant distribution device and an electronic apparatus having the same.

BACKGROUND

With the rapid growth of demand for the internet, artificial intelligence, and cloud services, servers constantly need to process a massive amount of data, thus it is necessary to continuously and effectively dissipate waste heat to maintain or upgrade the processing speed. Over time, the rise of computing power and density of servers has brought along higher thermal dissipation requirements, which has led to more and more people turning to liquid cooling.

A typical liquid-cooled system uses liquid as a conductor of heat and can incorporate a manifold and a pump to achieve a circulation of the liquid. The most common manifold is the open-loop manifold, including bottom-in bottom-out manifold or top-in top-out manifold, both of them can distribute the liquid to the heat sources at different areas of the system and then eject it out of the system.

However, both two types of manifold will cause uneven flow rate distribution in channels. Taking the bottom-in bottom-out manifold as an example, the flow rates in channels decreases with the increase of the distance to the liquid inlet (at the bottom side) since flowing liquid in pipe or duct may cause pressure drop due to factors such as frictional loss, local loss, change in elevation. As a result, different areas of the manifold will have a significant difference in flow rate, resulting in an insufficient amount of liquid for cooling some of the heat sources. According to statistics, in the traditional manifolds for server enclosure, the flow rates of some pipes will be greatly reduced due to the pressure drop, and the maximum percentage error compared to the predetermined average flow rate can even reach 178.4%. This clearly shows that the flow rate of some areas of the conventional manifold will be too low to effectively cool the respective heat sources, causing a great decrease in overall performance and even affecting the lifespan of the server.

SUMMARY

Accordingly, the present disclosure provides an active coolant distribution device and an electronic apparatus that are capable of achieving a uniform distribution of coolant.

One embodiment of the disclosure provides an active coolant distribution device configured for circulating a coolant and accommodating at least one flow generator. The active coolant distribution device includes a manifold including a first primary pipe, a second primary pipe, and a plurality of branches connected to the first primary pipe and the second primary pipe. At least one of the first primary pipe and the second primary pipe is suitable for accommodating the at least one flow generator. The second primary pipe includes a first hollow post, a first inner wall portion, and a second inner wall portion. The first hollow post has a plurality of first liquid inlets. The first liquid inlets are arranged along a long side direction of the first hollow post and respectively connected to the plurality of branches. The first inner wall portion and the second inner wall portion are arranged in the first hollow post, extending in the long side direction of the first hollow post, and spaced apart from each other so as to form a first channel, a second channel, and an accommodation space which are inside the first hollow post. The accommodation space is located between the first channel and the second channel, the first inner wall portion has at least one converging port, the second inner wall portion has at least one ejecting port, the first channel is located between and connected to the plurality of first liquid inlets and the at least one converging port and is connected to the accommodation space via the at least one converging port, the at least one ejecting port is connected to and located between the accommodation space and the second channel.

Another embodiment of the disclosure provides an electronic apparatus configured for circulating a coolant and accommodating at least one flow generator. The electronic apparatus includes an enclosure and an active coolant distribution device. The active coolant distribution device is disposed on the enclosure. The active coolant distribution device includes a manifold including a first primary pipe, a second primary pipe, and a plurality of branches connected to the first primary pipe and the second primary pipe. At least one of the first primary pipe and the second primary pipe is suitable for accommodating the at least one flow generator. The second primary pipe includes a first hollow post, a first inner wall portion, and a second inner wall portion. The first hollow post has a plurality of first liquid inlets. The first liquid inlets are arranged along a long side direction of the first hollow post and respectively connected to the plurality of branches. The first inner wall portion and the second inner wall portion are arranged in the first hollow post, extending in the long side direction of the first hollow post, and spaced apart from each other so as to form a first channel, a second channel, and an accommodation space which are inside the first hollow post. The accommodation space is located between the first channel and the second channel, the first inner wall portion has at least one converging port, the second inner wall portion has at least one ejecting port, the first channel is located between and connected to the plurality of first liquid inlets and the at least one converging port and is connected to the accommodation space via the at least one converging port, the at least one ejecting port is connected to and located between the accommodation space and the second channel.

Another embodiment of the disclosure provides an active coolant distribution device configured for circulating a coolant. The active coolant distribution device includes a manifold and at least one flow generator. The manifold includes a first primary pipe, a second primary pipe, and a plurality of branches connected to the first primary pipe and the second primary pipe. The second primary pipe includes a first hollow post, a first inner wall portion, and a second inner wall portion. The first hollow post has a plurality of first liquid inlets. The first liquid inlets are arranged along a long side direction of the first hollow post and respectively connected to the plurality of branches. The first inner wall portion and the second inner wall portion are arranged in the first hollow post, extending in the long side direction of the first hollow post, and spaced apart from each other so as to form a first channel, a second channel, and an accommodation space which are inside the first hollow post. The accommodation space is located between the first channel and the second channel, the first inner wall portion has at least one converging port, the second inner wall portion has at least one ejecting port, the first channel is located between and connected to the plurality of first liquid inlets and the at least one converging port and is connected to the accommodation space via the at least one converging port, the at least one ejecting port is connected to and located between the accommodation space and the second channel. The at least one flow generator is accommodated in at least one of the first primary pipe and the second primary pipe.

According to the active coolant distribution device and the electronic apparatus as discussed in the above embodiments of the disclosure, the placement of one or more flow generators in at least one of the first primary pipe and the second primary pipe can compensate the pressure drop caused by frictional loss, local loss, and change in elevation. As a result, the flow rates of the branches are prevented from decreasing with the increase of the distance to the liquid inlet, thus achieving a uniform distribution of coolant of the flow field and ensuring a sufficient amount of coolant required for cooling each heat source.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Figure 1:
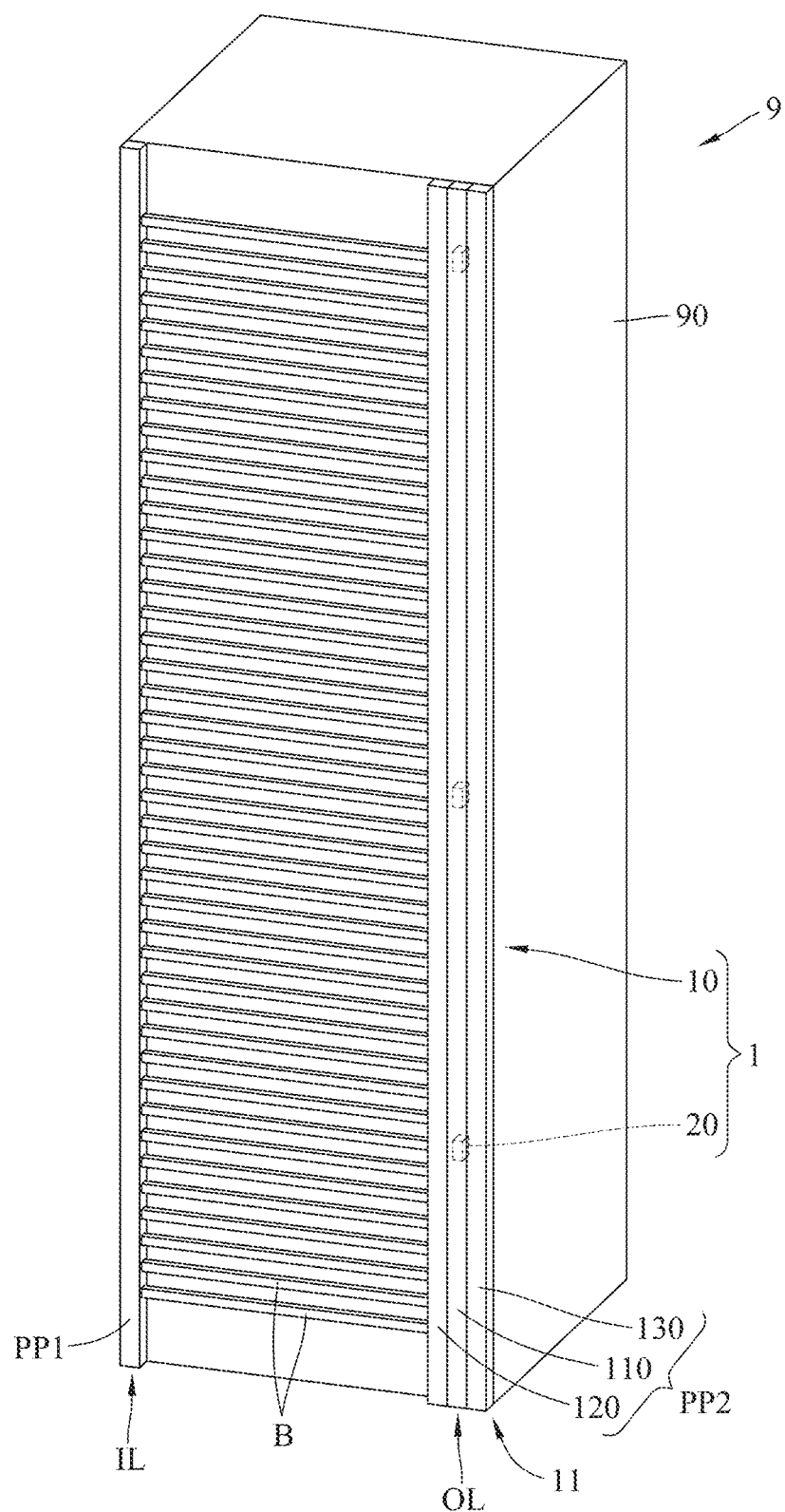
FIG. 1 is a perspective view of an electronic apparatus according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details.

The following embodiments will be described with reference to the drawings. For the purpose of clear illustration, some conventional elements and components may be illustrated in a simple and clear manner. Some of the features in the drawings may be slightly exaggerated or illustrated in a larger proportion for the ease of viewing but are not intended to limit the disclosure. In addition, for the same reason, some of the elements or components in the drawings may be illustrated in dotted lines.

Herein, the terms, such as "end", "part", "portion", "area", may be used to refer to specific features of or between elements or components but are not intended to limit the elements and components. In addition, the terms, such as "substantially" and "approximately", as used herein may mean a reasonable amount of deviation of the described term such that the end result is not significantly changed.

Further, unless explicitly stated, the term "at least one" as used herein may mean that the quantity of the described element or component is one or larger than one but does not necessarily mean that the quantity is only one. The term "and/or" may be used herein to indicate that either or both of two stated possibilities.

Figure 2:
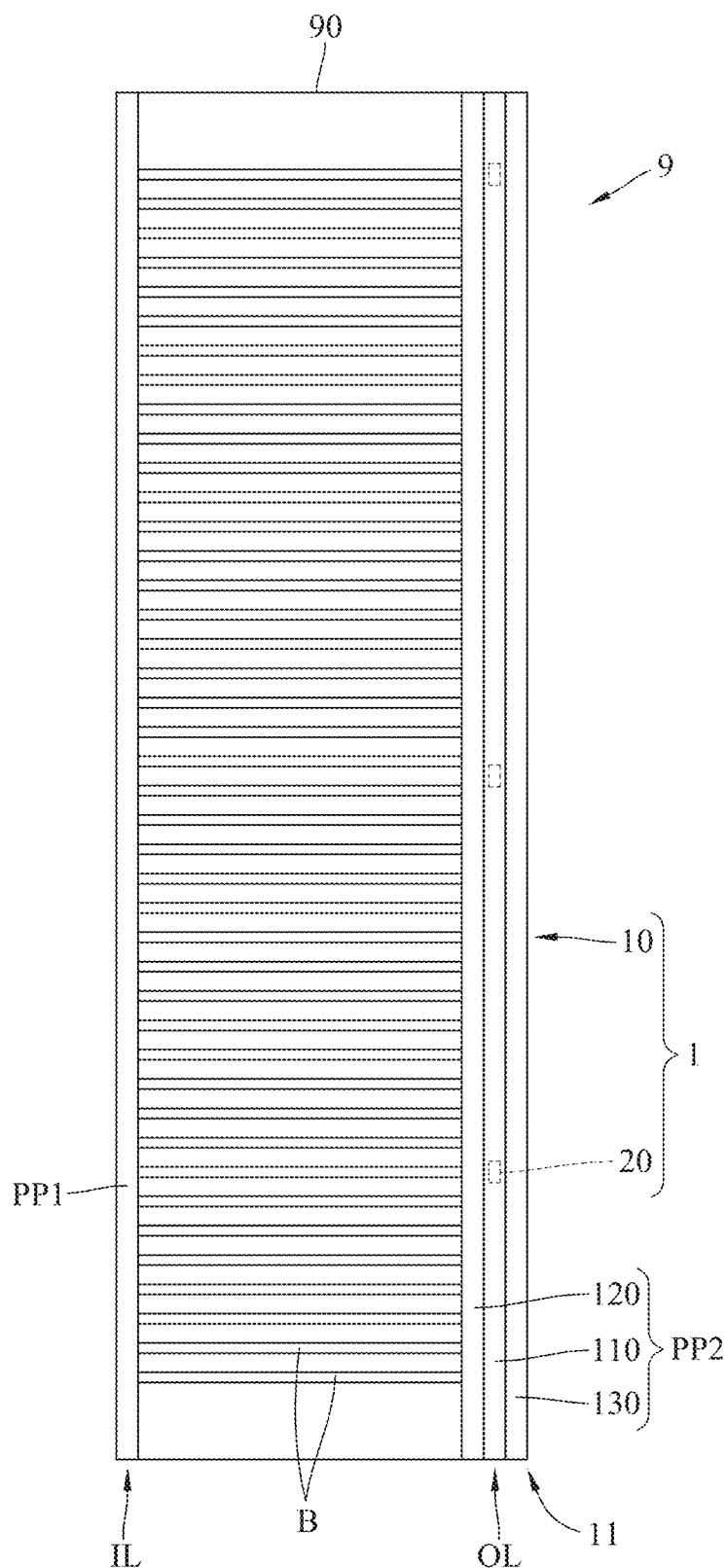
FIG. 2 is a planar view of an active coolant distribution device in FIG. 1.

Firstly, referring to FIGS. 1-2, one embodiment of the disclosure provides an electronic apparatus 9. The electronic apparatus 9 is, for example, a server, and its type shown in the drawings is exemplary but not intended to limit the electronic apparatus 9. In this embodiment, the electronic apparatus 9 is a high power density system and therefore requires dissipate heat by liquid cooling to maintain or improve performance. As shown, one embodiment provides an active coolant distribution device 1 that is suitable for distributing coolant for the electronic apparatus 9.

The active coolant distribution device 1 is configured to be arranged at a side of an enclosure 90 of the electronic apparatus 9, coolant can be injected into the manifold 10 via a liquid inlet end IL of the manifold 10 so as to be evenly distributed to the predetermined places on the enclosure 90 to absorb heat and then to be discharged from a liquid outlet end OL of the manifold 10. The coolant used herein can be any suitable heat dissipation medium and is not intended to limit the disclosure. In addition, the active coolant distribution device 1 can employ one or more typical coolant distribution units (CDU) (not shown) existing in the market, such that the flow rate and pressure of the coolant can be predetermined, but the configuration and number of the CDU are optional and not intended to limit the disclosure.

Generally, in fluid flow, friction loss (or skin friction) is the loss or pressure or "head" that occurs in pipe or duct flow due to the effect of the fluid's viscosity near the surface of the pipe or duct, and pressure loss also occurs due to a change in elevation of the fluid. That is, flowing liquid in pipe or duct may cause pressure drop due to factors such as frictional loss, local loss, change in elevation, or diversion. This will cause the coolant flow rate to decrease with the increase of the distance the coolant passes through the inlet. To avoid this problem, the active coolant distribution device 1 is provided.

Hereinafter, the active coolant distribution device 1 is described in detail with reference to FIGS. 1-3. In this embodiment, the active coolant distribution device 1 may include a manifold 10 and a plurality of flow generators 20, where the manifold 10 is able to accommodate the flow generators 20 so that the flow generators 20 can add pressure to the coolant system in the manifold 10 so as to compensate the pressure drop of coolant. In specific, the manifold 10 may include a first primary pipe PP1, a second primary pipe PP2, and a plurality of branches B, the first primary pipe PP1 and the second primary pipe PP2 are two vertical pipes spaced apart from each other, the liquid inlet end IL is located at one end of the first primary pipe PP1, the liquid outlet end OL is located at one end of the second primary pipe PP2, the branches B are spaced apart from each other and located between and connected to the first primary pipe PP1 and the second primary pipe PP2, in other words, two opposite ends of each branch B are respectively connected to the first primary pipe PP1 and the second primary pipe PP2. In such an arrangement, coolant is allowed to enter into the manifold 10 from one end of the first primary pipe PP1 (i.e., the liquid inlet end IL) and then be distributed into the branch B and converged to the second primary pipe PP2 and flow out of the manifold from one end of the second primary pipe PP2 (i.e., the liquid outlet end OL).

As shown, the manifold 10 provides a bottom-in bottom-out coolant circulation, that is, the liquid inlet end IL and the liquid outlet end OL are both arranged at the bottom of the enclosure 90, but the disclosure is not limited by the arrangement of the liquid inlet end IL and the liquid outlet end OL. In some other embodiments, the liquid inlet end and the liquid outlet end may be arranged to the top of the manifold so as to provide a top-in top-out coolant circulation. Note that the manifold 10 has an access side 11 being a side of the manifold 10 having the liquid inlet end IL and the liquid outlet end OL. It is also noted that the arrangements and directions of the below-described components and elements are defined with reference to a major axis or longitudinal axis of the first primary pipe PP1 or the second primary pipe PP2. The 'major axis' and 'longitudinal axis' (as indicated by arrow A in FIG. 3) is parallel to an extension direction or long side of the first primary pipe PP1 and the second primary pipe PP2.

Further, in this embodiment, the first primary pipe PP1 is a hollow pipe body opened at one end (i.e., the liquid inlet end IL) and closed at the other end, each of the branches B is a hollow pipe body being opened at two opposite ends, the first primary pipe PP1 has holes (not shown) respectively connected to the branches B, such that the coolant can flow into the branches B from the first primary pipe PP1. It is noted that the configurations of the first primary pipe PP1 and the branches B may be modified as required and are not intended to limit the disclosure.

Further, in this embodiment, the second primary pipe PP2 may include a first branching pipe 110, a second branching pipe 120 and a third branching pipe 130. Each of the first branching pipe 110, the second branching pipe 120, and the third branching pipe 130 has a hollow pipe body substantially extending in the same direction (i.e., the long side direction). The first branching pipe 110 is located between and connected to the second branching pipe 120 and the third branching pipe 130, and the second branching pipe 120 is located between and connected to the branched B and the first branching pipe 110. The opened ends of the first branching pipe 110, the second branching pipe 120, and the third branching pipe 130 together form the liquid outlet end OL of the manifold 10. In other words, the coolant flowing into the second primary pipe PP2 from the branches B can be distributed into the second branching pipe 120, the first branching pipe 110, and the third branching pipe 130 and then converged to the liquid outlet end OL.

Figure 3:
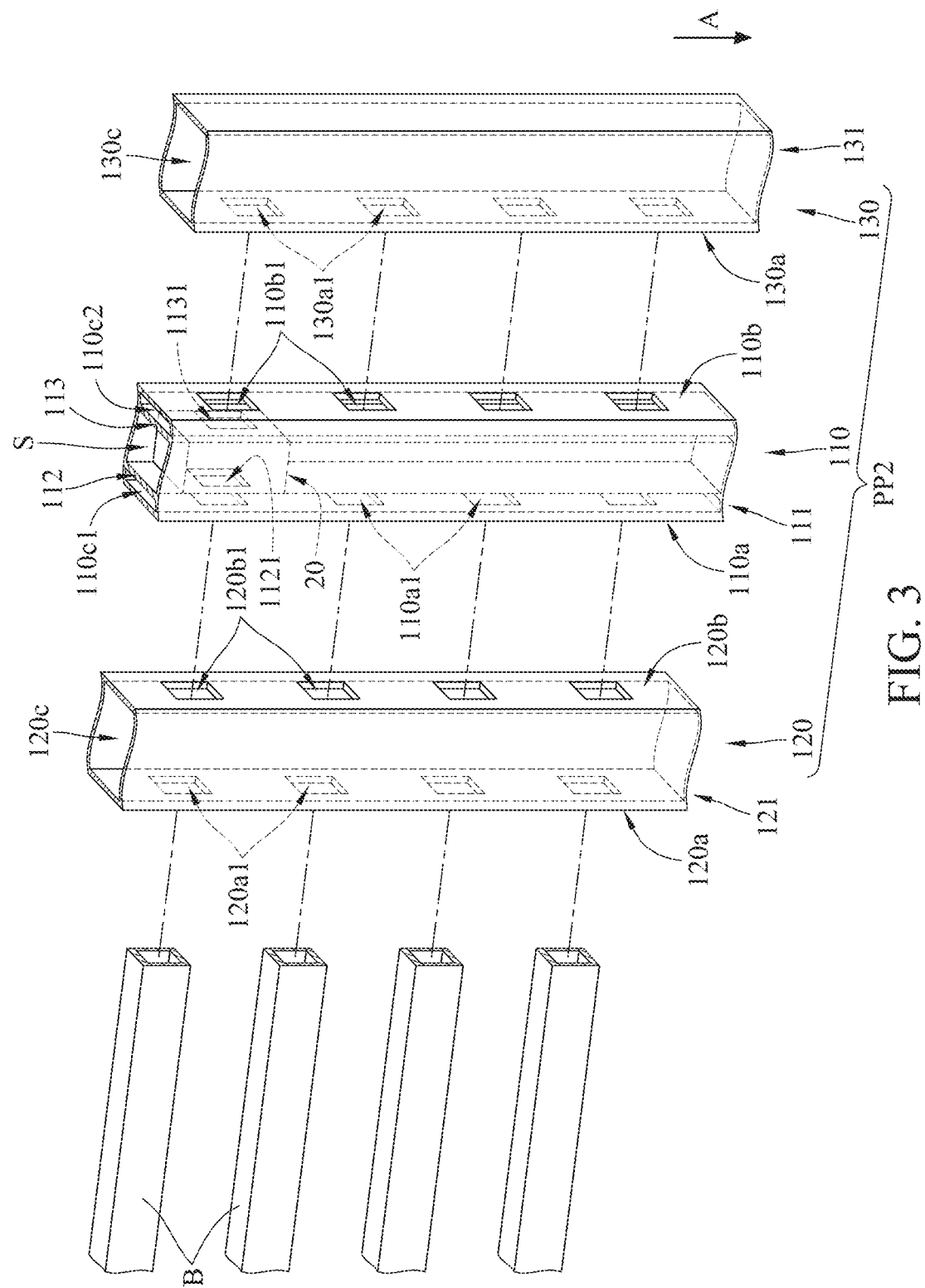
FIG. 3 is a partial enlarged exploded view of the active coolant distribution device in FIG. 1.

In detail, as shown in FIG. 3, in this embodiment, the first branching pipe 110 may include a first hollow post 111, a first inner wall portion 112, and a second inner wall portion 113. The first hollow post 111 extends in the long side direction (as indicated by the arrow A). The first hollow post 111 may have a circular or square column shape, but the shape of the first hollow post 111 may be modified as required. The first hollow post 111 may have an inlet side 110a and an outlet side 110b respectively located at two opposite sides of the first hollow post 111. As shown, the inlet side 110a and the outlet side 110b are two opposite sides of the first hollow post 111 that are used to respectively connect or contact the second branching pipe 120 and the third branching pipe 130.

The first hollow post 111 may further have a plurality of first liquid inlets 110a1 and a plurality of first liquid outlets 110b1. The first liquid inlets 110a1 are arranged at the inlet side 110a. The first liquid inlets 110a1 are arranged along the long side direction and spaced apart from each other. The first liquid inlets 110a1 are through holes that connect the internal space of the first hollow post 111. The first liquid outlets 110b1 are arranged at the outlet side 110b. The first liquid outlets 110b1 are arranged along the long side direction and spaced apart from each other. The first liquid outlets 110b1 are through holes that connect the internal space of the first hollow post 111.

The first inner wall portion 112 and the second inner wall portion 113 are located within the first hollow post 111 and extend in the long side direction so as to divide the internal space of the first hollow post 111 into a first channel 110c1, a second channel 110c2, and an accommodation space S that extend in the long side direction. The accommodation space S is located between the first channel 110c1 and the second channel 110c2, where the first channel 110c1 is located at a side of the accommodation space S close to the first liquid inlets 110a1 and are connected to the first liquid inlets 110a1, the second channel 110c2 is located at a side of the accommodation space S close to the first liquid outlets 110b1 and are connected to the first liquid outlets 110b1. In other words, the first channel 110c1 is located between the first liquid inlet 110a1 and the first inner wall portion 112, and the second channel 110c2 is located between the first liquid outlet 110b1 and the second inner wall portion 113.

In addition, the first inner wall portion 112 may have a plurality of converging ports 1121, the converging ports 1121 are spaced apart from each other and arranged along the long side direction, and the converging ports 1121 are through holes that connect the first channel 110c1 to the accommodation space S. Further, the second inner wall portion 113 may have a plurality of ejecting ports 1131, the ejecting ports 1131 are spaced apart from each other and arranged along the long side direction, and the ejecting ports 1131 are through holes that connect the second channel 110c2 to the accommodation space S.

The flow generator 20 is, for example, a pump or a fan that is suitable for operating while being immersed in the coolant. In this embodiment, the flow generators 20 are arranged within the accommodation space S and in positions corresponding to the converging ports 1121 and the ejecting ports 1131, that is, each of the flow generators 20 is located between the converging port 1121 of the first inner wall portion 112 and the ejecting port 1131 of the second inner wall portion 113. In such an arrangement, the flow generators 20 are able to intake the coolant near the converging port 1121 towards the ejecting port 1131. That is, the flow generator 20 is able to form a flow field of converging coolant into the converging port 1121 and discharging coolant out of the ejecting port 1131 among the first channel 110c1, the accommodation space S and the second channel 110c2. In other words, the flow generator 20 can provide the coolant kinetic energy to force it to flow into the converging port 1121 and then flow out of the ejecting port 1131.

The second branching pipe 120 may include a second hollow post 121 extending in the long side direction. The second hollow post 121 may have a circular or square column shape, but the shape of the second hollow post 121 may be modified as required. The second hollow post 121 may have a third channel 120c extending in the long side direction. In addition, the second hollow post 121 may have an inlet side 120a and an outlet side 120b respectively located at two opposite sides of the second hollow post 121. As shown, the inlet side 120a and the outlet side 120b are two opposite sides of the second hollow post 121 that are used to respectively connect or contact the branches B and the first branching pipe 110.

The second hollow post 121 may further have a plurality of second liquid inlets 120a1 and a plurality of second liquid outlets 120b1. The second liquid inlets 120a1 are formed on the inlet side 120a. The second liquid inlets 120a1 are spaced apart from each other and arranged along the long side direction. The second liquid inlets 120a1 are through holes that directly connect the third channel 120c of the second hollow post 121 and respectively directly connect the branches B. The second liquid outlets 120b1 are formed on the outlet side 120b. The second liquid outlets 120b1 are spaced apart from each other and arranged along the long side direction. The second liquid outlets 120b1 are through holes that directly connect the third channel 120c of the second hollow post 121 and respectively directly connect the first liquid inlets 110a1 formed on the inlet side 110a of the first branching pipe 110. That is, the coolant from the branches B is allowed to sequentially pass through the second liquid inlets 120a1 on the inlet side 120a of the second branching pipe 120, the third channel 120c, the second liquid outlets 120b1 on the outlet side 120b, and the first channel 110c1 and the second channel 110c2 of the first branching pipe 110.

The third branching pipe 130 may include a third hollow post 131. The third hollow post 131 extends in the long side direction. The third hollow post 131 may have a circular or square column shape, but the shape of the third hollow post 131 may be modified as required. The third hollow post 131 may have a fourth channel 130c extending in the long side direction. In addition, the third hollow post 131 may have an inlet side 130a. The inlet side 130a is a side of the third hollow post 131 that is used to connect or contact the first branching pipe 110. The third hollow post 131 may have a plurality of third liquid inlets 130a1. The third liquid inlets 130a1 are arranged at the inlet side 130a. The third liquid inlets 130a1 are arranged along the long side direction and spaced apart from each other. The third liquid inlets 130a1 are through holes that connect the fourth channel 130c of the third hollow post 131 and respectively connect the first liquid outlets 110b1 on the outlet side 110b of the first branching pipe 110 so as to converge the coolant coming from the first liquid outlets 110b1 of the first branching pipe 110 into the fourth channel 130c.

Figure 4:
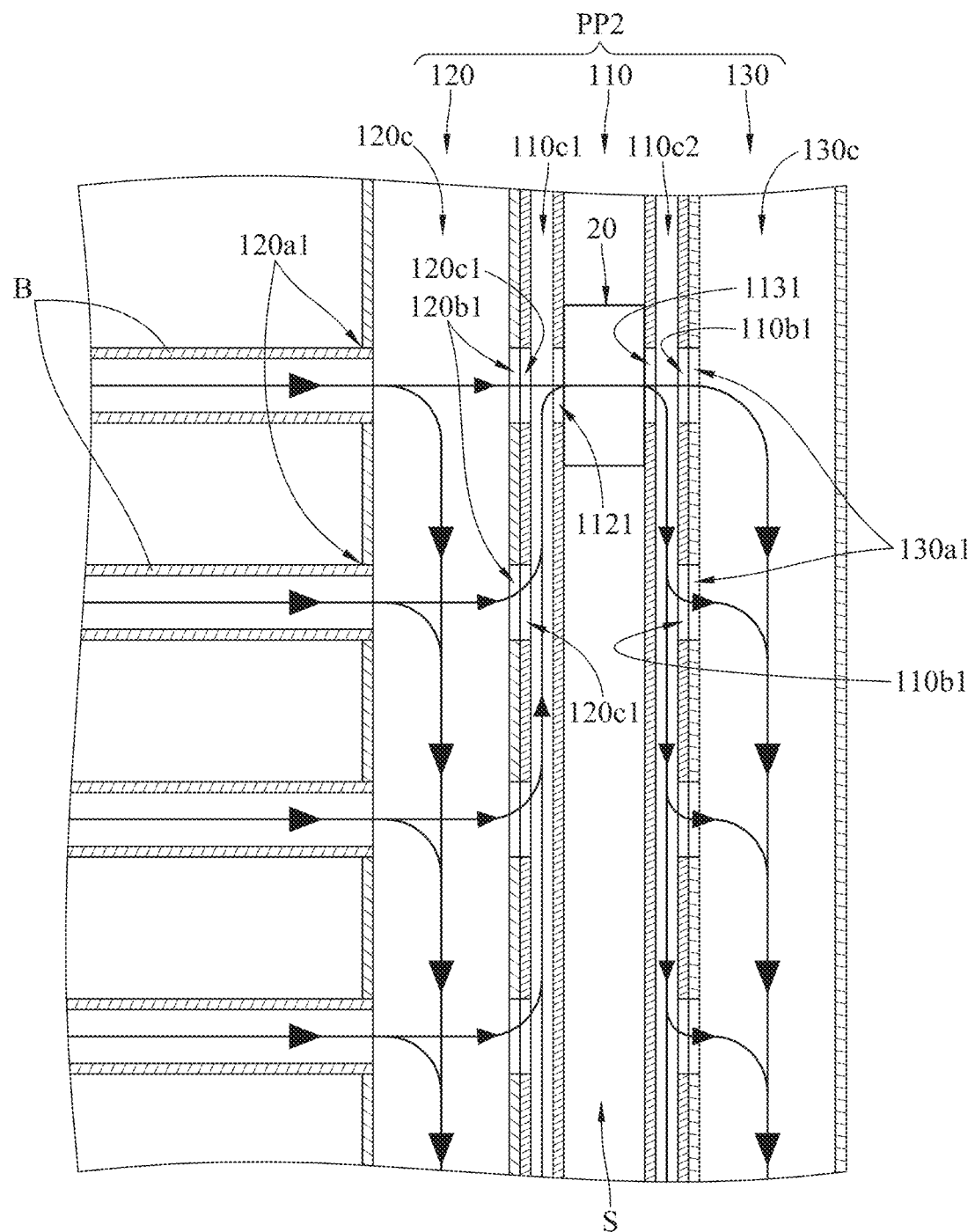
FIG. 4 is a partial enlarged flow simulation of the active coolant distribution device in FIG. 1.

Referring to FIG. 4, there is shown a partial enlarged flow simulation of the active coolant distribution device 1. As shown, in the pipeline arrangement of the active coolant distribution device 1, the coolant flowing into the second primary pipe PP2 from the branches B can flow downwardly along the third channel 120c of the second branching pipe 120, meanwhile, the flow generator 20 can draw the coolant near the second liquid outlets 120b1 of the second branching pipe 120 into the first channel 110c1 of the first branching pipe 110, such that there is part of the coolant flowing downwardly along the first channel 110c1. Also, the flow generator 20 can draw the coolant into the converging port 1121 and force it to flow toward the ejecting port 1131. The coolant passing through the ejecting port 1131 flows downwardly along the second channel 110c2 and can flow through the first liquid outlet 110b1 and the third liquid inlet 130a1 and then flow downwardly along the fourth channel 130c of the third branching pipe 130.

As discussed, the cooperation of the flow generator 20 and the second primary pipe PP2 can provide force at a side of a part of the branches B to force part of the coolant to flow in a direction different from the long side direction before the coolant downwardly reaches the liquid outlet end OL, in specific, the flow generators 20 can force part of the coolant to flow in an upward direction to compensate for the decrease of the flow rate of the branches B caused by pressure drop. As a result, a uniform distribution of flow rates among the branches B is obtained.

Figure 5:
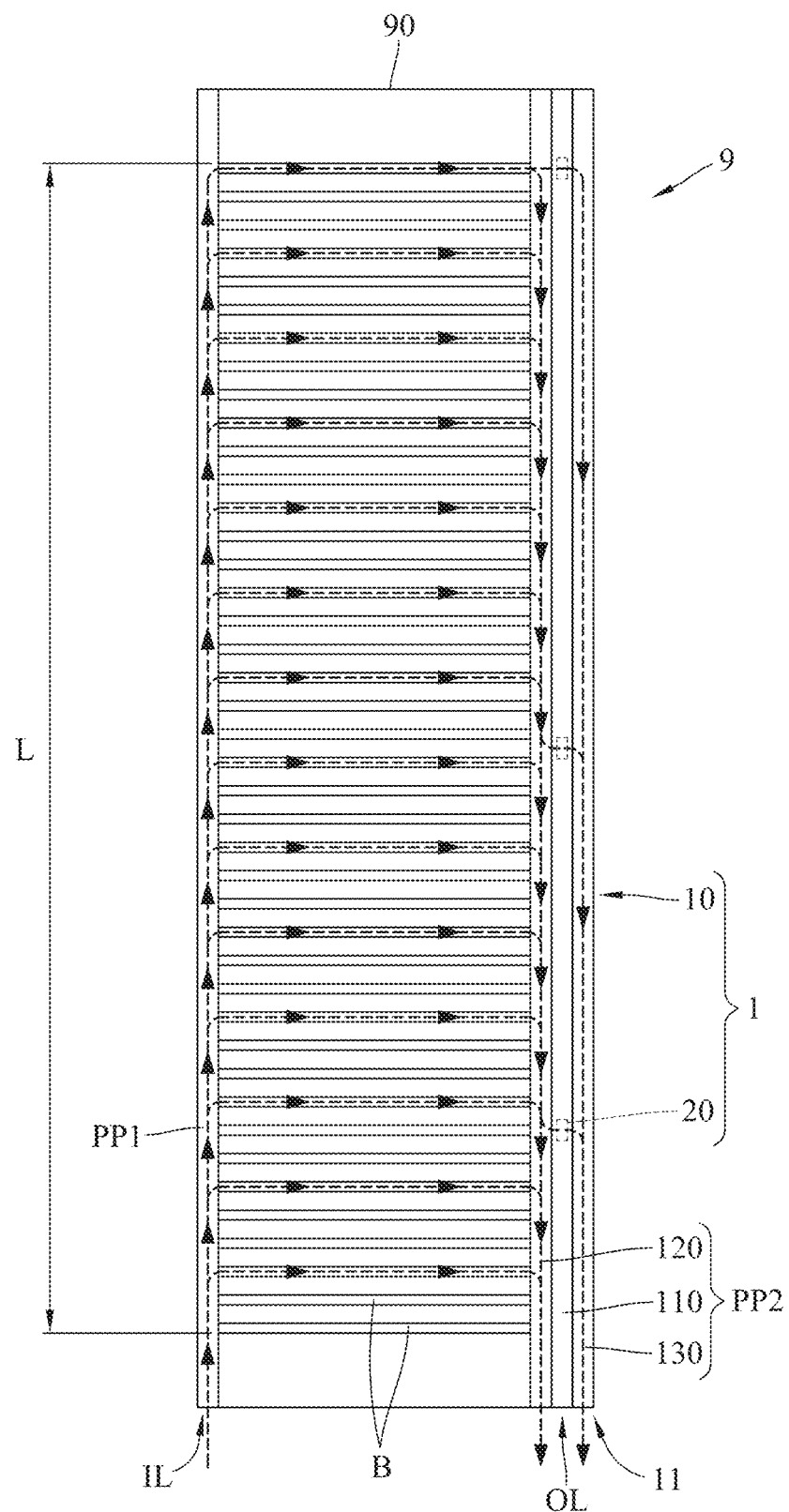
FIG. 5 is an overall flow simulation of the active coolant distribution device on the electronic apparatus.

Herein, referring to FIG. 5, the overall flow field in the active coolant distribution device 1 is presented as an arrow plot. It is noted that the quantity and location of the arrows are for illustrating the flow of the coolant but not intended to represent or limit the actual condition of the flow field. As shown, the coolant entering into the manifold 10 from the liquid inlet end IL is distributed to the branches B via the first primary pipe PP1, and the flow generators 20 that are arranged next to the branches B can draw the coolant so as to ensure a sufficient amount of coolant to flow through all of the branches B.

In general, the existence of the flow generators 20 in the second primary pipe PP2 can compensate the pressure drop caused by frictional loss, local loss, and change in elevation, thereby preventing the flow rate from decreasing with the increase of the distance to the liquid inlet (i.e., the liquid inlet end IL on the access side 11). That is, the flow rate of coolant among all of the branches B can be kept in a sufficient amount for cooling the respective heat sources regardless of the distance to the liquid inlet.

The second primary pipe PP2, as shown, only employs three flow generators 20, but a proper arrangement of the flow generators 20 still can achieve a uniform distribution of flow rates among the branches B even when the number of the flow generators 20 is way less than that of the branches B. The detailed explanation is given below.

In this embodiment, the enclosure 90 of the electronic apparatus 9 may have a height of 42U, and the quantity of the branches B is 42, in order to distinguish different flow generators 20, the locations of the flow generators 20 can be defined using the length of the range of the branches B on the manifold 10. Herein, L denotes the distance between the branch B closest to the access side 11 and the branch B farthest from the access side 11, in such a definition, at least one flow generator 20 is disposed at a position L/2n away from the access side 11, where n is an integer equal to or larger than 0. As shown, one of the flow generators 20 is at a position L away from the access side 11, another flow generator 20 is at a position L/2 away from the access side 11, and another flow generator 20 is at a position L/4 away from the access side 11. Alternatively, the locations of the flow generators 20 can be defined using the quantity of the branches B, the first branch B farthest away from the access side 11 denotes $1^{st}$ branch B, the other branches B arranged in a direction towards the access side 11 is $2^{nd}$ branch B, $3^{rd}$ branch B, $4^{th}$ branch B . . . and $42^{nd}$ branch B, in such a definition, the flow generators 20 are respectively arranged next to the $1^{st}$ branch B, the $21^{st}$ and $22^{nd}$ branches B, and the $32^{nd}$ branch B.

Figure 6:
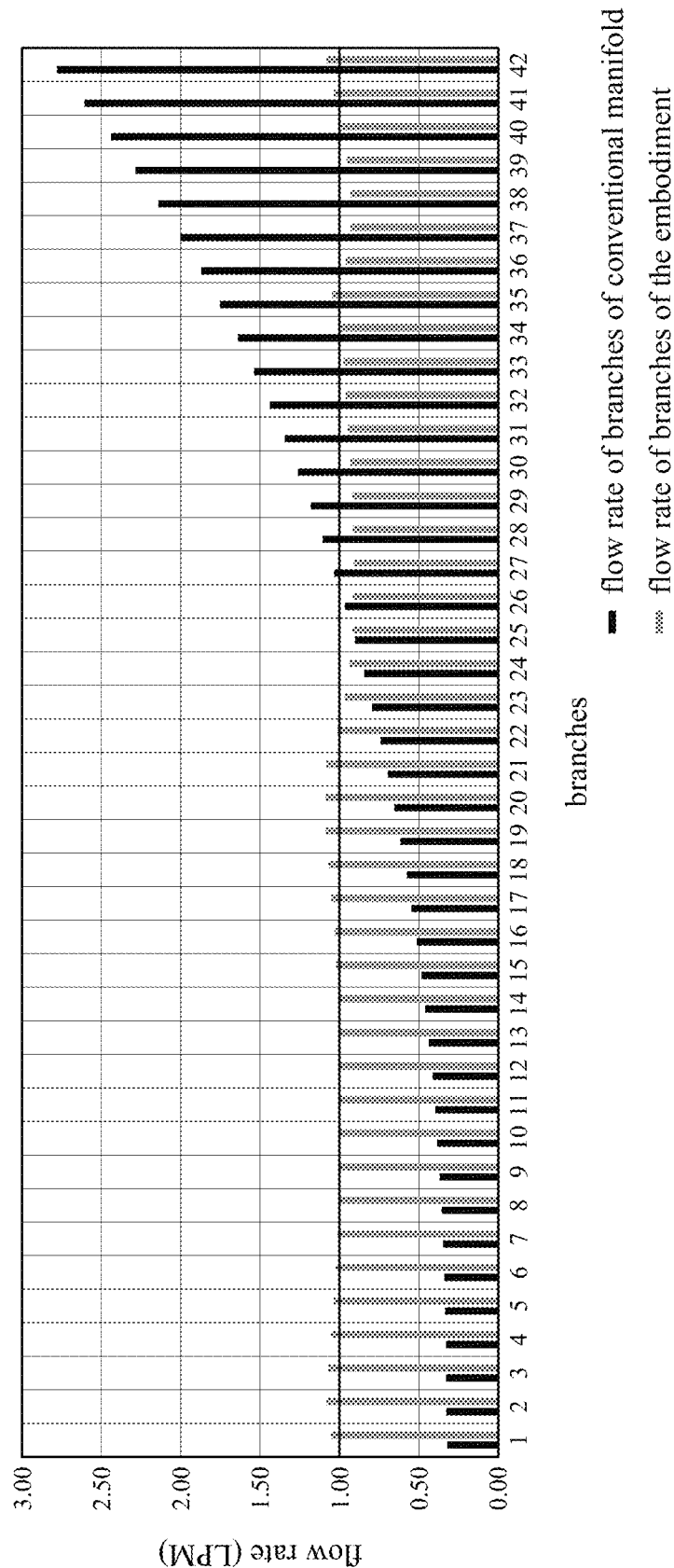
FIG. 6 is a flow distribution comparison between the electronic apparatus of one embodiment of the disclosure and a conventional electronic apparatus.
Figure 7:
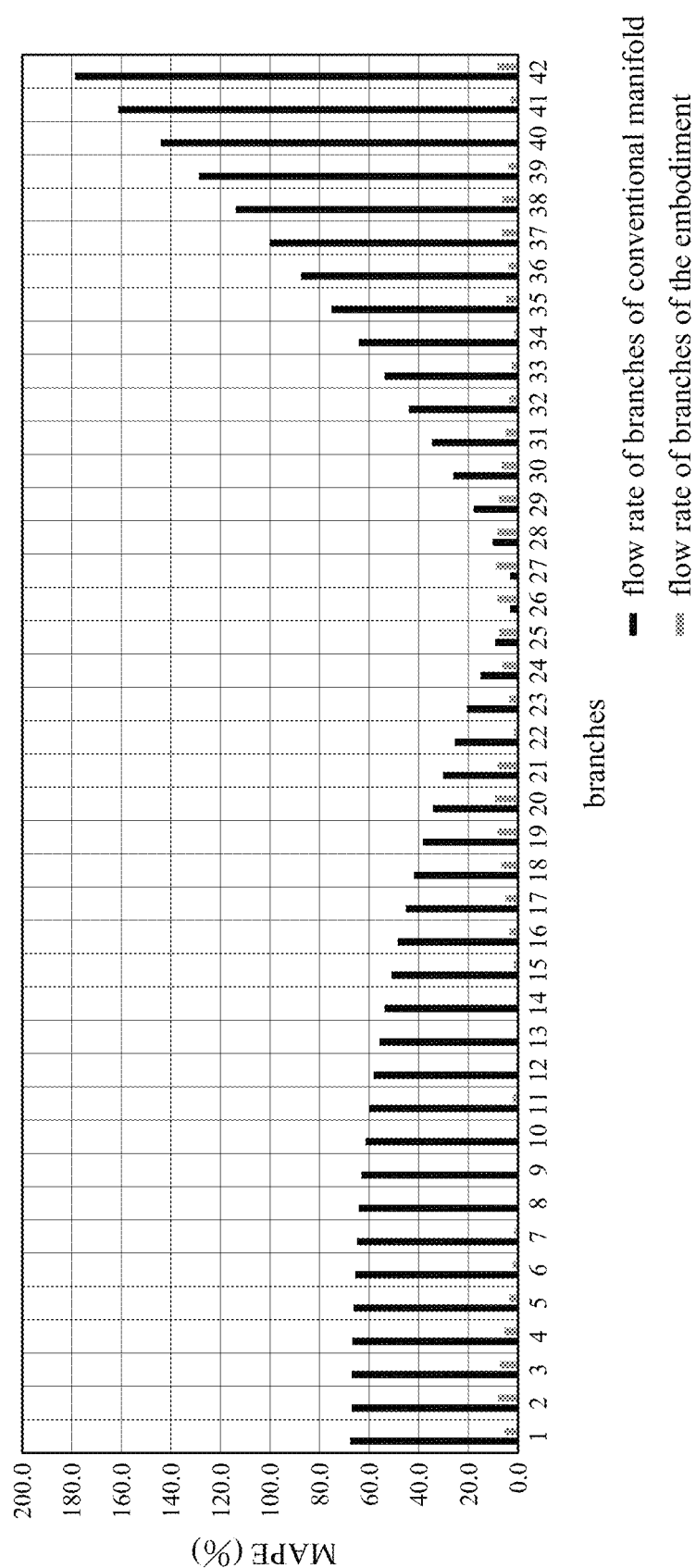
FIG. 7 is a mean absolute percentage error (MAPE) comparison between the electronic apparatus of one embodiment of the disclosure and a conventional electronic apparatus in terms of flow rate.

This arrangement of the flow generators 20 in the second primary pipe PP2 is able to achieve a uniform distribution of coolant among all of the branches B. In this regard, please refer to FIGS. 6-7, FIG. 6 a flow distribution comparison between the active coolant distribution device 1 of one embodiment of the disclosure and a conventional manifold, and FIG. 7 is a mean absolute percentage error (MAPE) comparison between the active coolant distribution device 1 of one embodiment of the disclosure and the same conventional manifold in terms of flow distribution. As shown in FIG. 6, the flow rates among the $1^{st}$ to $42^{nd}$ branches B in the active coolant distribution device 1 are substantially uniformly around 1.0 LPM (liter per minute), in FIG. 7, the MAPE of flow rates of all of the branches B in the active coolant distribution device 1 are less than 10%, the highest value is around 9.09%. In contrast, in the conventional manifold, in FIG. 6, the flow rate farther away from the inlet is far below 1.0 LPM but the flow rate closer to the inlet is much higher than 1.0 LPM; in FIG. 7 shows that the highest MAPE of flow rates of the branches goes up to 178.4%.

This is apparent that the above arrangement of the flow generators 20 in the second primary pipe PP2 can ensure a uniform distribution of flow rates among all of the branches B so as to ensure that all of the branches B can obtain a flow rate of coolant required for cooling heat source.

It is noted that the quantity of the flow generators 20 can be adjusted according to actual requirements, such as the height of the enclosure and the quantity and length of the branches. In some embodiments, the second primary pipe PP2 may contain a plurality of flow generators 20 in the number as the same as that of the branches B; in another embodiment, the number of the flow generators 20 may be further reduced based on the consideration of simple design, effectiveness, and cost. In yet another embodiment, when the enclosure has shorter height and has less number of the branches, the active coolant distribution device may only employ one flow generator being arranged next to the branch farthest away from the access side, which also can achieve a uniform distribution of flow rates throughout the enclosure.

Figure 8:
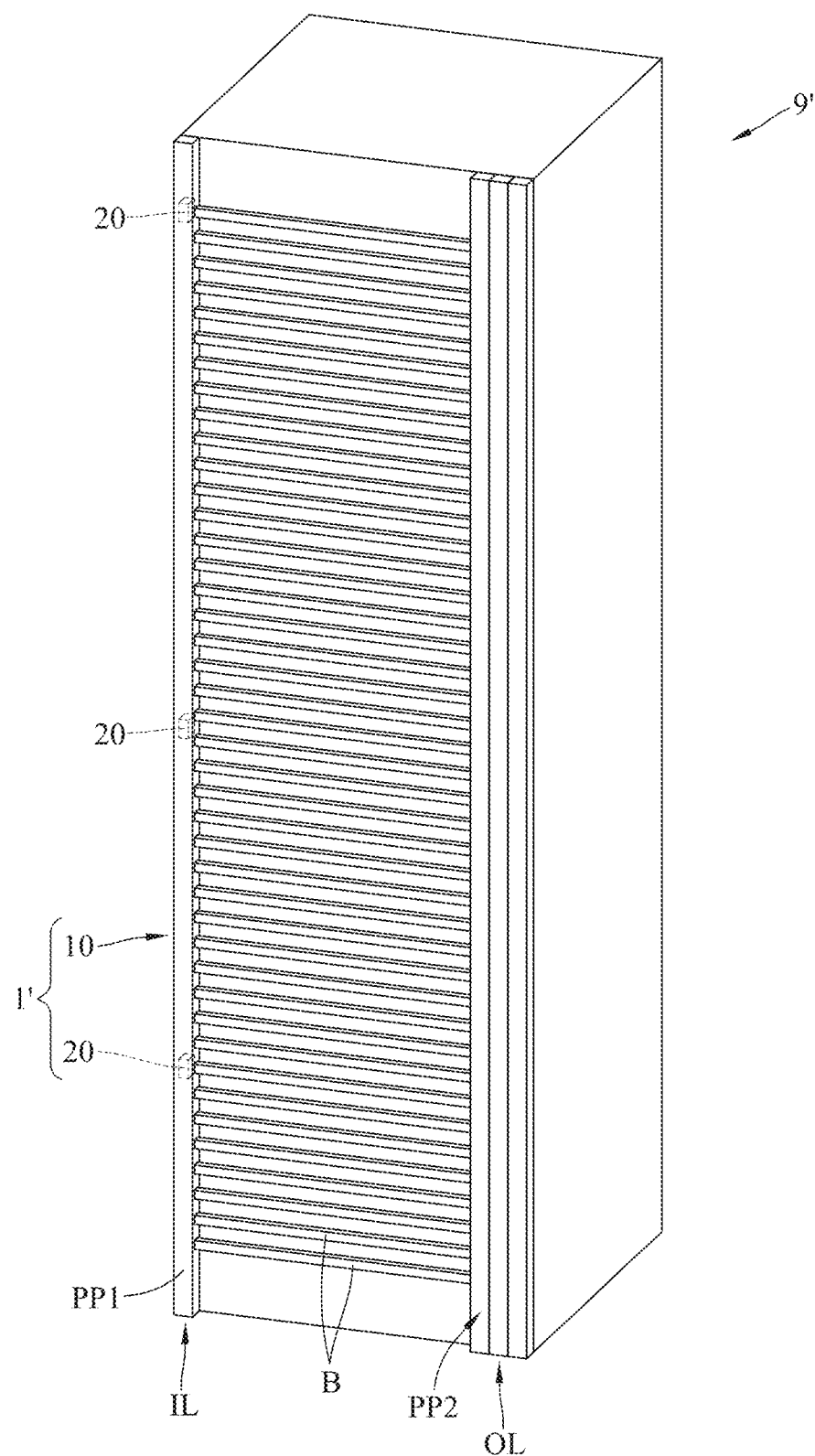
FIG. 8 is a perspective view of an electronic apparatus according to another embodiment of the disclosure.

In addition, the flow generators 20 are not restricted to be arranged at the second primary pipe PP2. For example, referring to FIG. 8, another embodiment of the disclosure provides an electronic apparatus 9', the electronic apparatus 9' may employ the aforementioned manifold 10 and flow generator 20, the main difference between an active coolant distribution device 1' of the this embodiment and the active coolant distribution device 1 of the previous embodiments is that the active coolant distribution device 1' has its flow generators 20 arranged in the first primary pipe PP1. More specifically, there are three flow generators 20 in the active coolant distribution device 1', and these flow generators 20 can be arranged in the same manner as that of the flow generators 20 in the first primary pipe PP1 of the active coolant distribution device 1, that is, the flow generators 20 can be respectively arranged next to the $1^{st}$ branch B, the $21^{st}$ and $22^{nd}$ branches B, and the $32^{nd}$ branch B. In such an arrangement, the active coolant distribution device 1' also can compensate the pressure drop caused by frictional loss, local loss, and change in elevation, thereby ensuring a sufficient amount of coolant for each branch.

Figure 9:
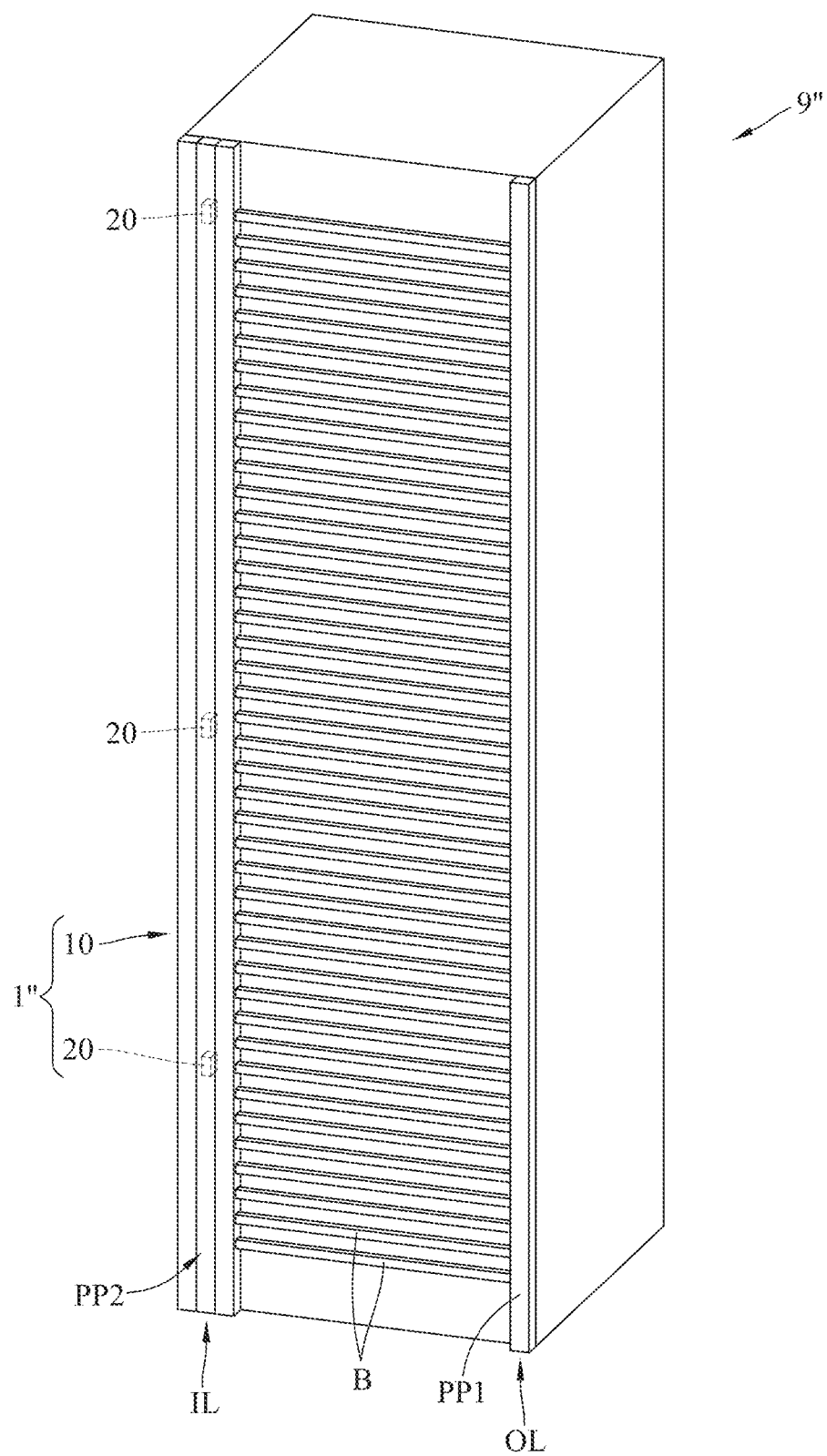
FIG. 9 is a perspective view of an electronic apparatus according to yet another embodiment of the disclosure.

Further, the first primary pipe and the second primary pipe may be swapped places as required. For example, referring to FIG. 9, another embodiment of the disclosure provides an electronic apparatus 9", the electronic apparatus 9" may employ the aforementioned manifold 10 and flow generator 20, the main difference between an active coolant distribution device 1" of the this embodiment and the active coolant distribution device 1 of the previous embodiments is that the active coolant distribution device 1" have its first primary pipe PP1 and second primary pipe PP2 swapped places, such that the liquid inlet end IL is located at the second primary pipe PP2, the liquid outlet end OL is located at the first primary pipe PP1. This arrangement also can compensate the pressure drop caused by frictional loss, local loss, and change in elevation, thereby ensuring a sufficient amount of coolant for each branch.

Further, any one of the active coolant distribution devices in the previous embodiments can employ one or more sensors (not shown) to achieve automatic control. In detail, one or more sensors that are suitable for timely detecting physical values of the coolant (e.g., flow rate or pressure) can be placed within the flow field of the active coolant distribution device. Note that the location and number of the said sensors in the active coolant distribution device can be adjusted as required. The values detected by the sensors can be fed back to the control center (not shown) so that the control center can timely adjust the output or operation mode of the flow generators and therefore each flow generator become very responsive to the change of the flow field around. And this help to further reduce the MAPE of flow rate of each branch to a value under 10%.

Figure 10:
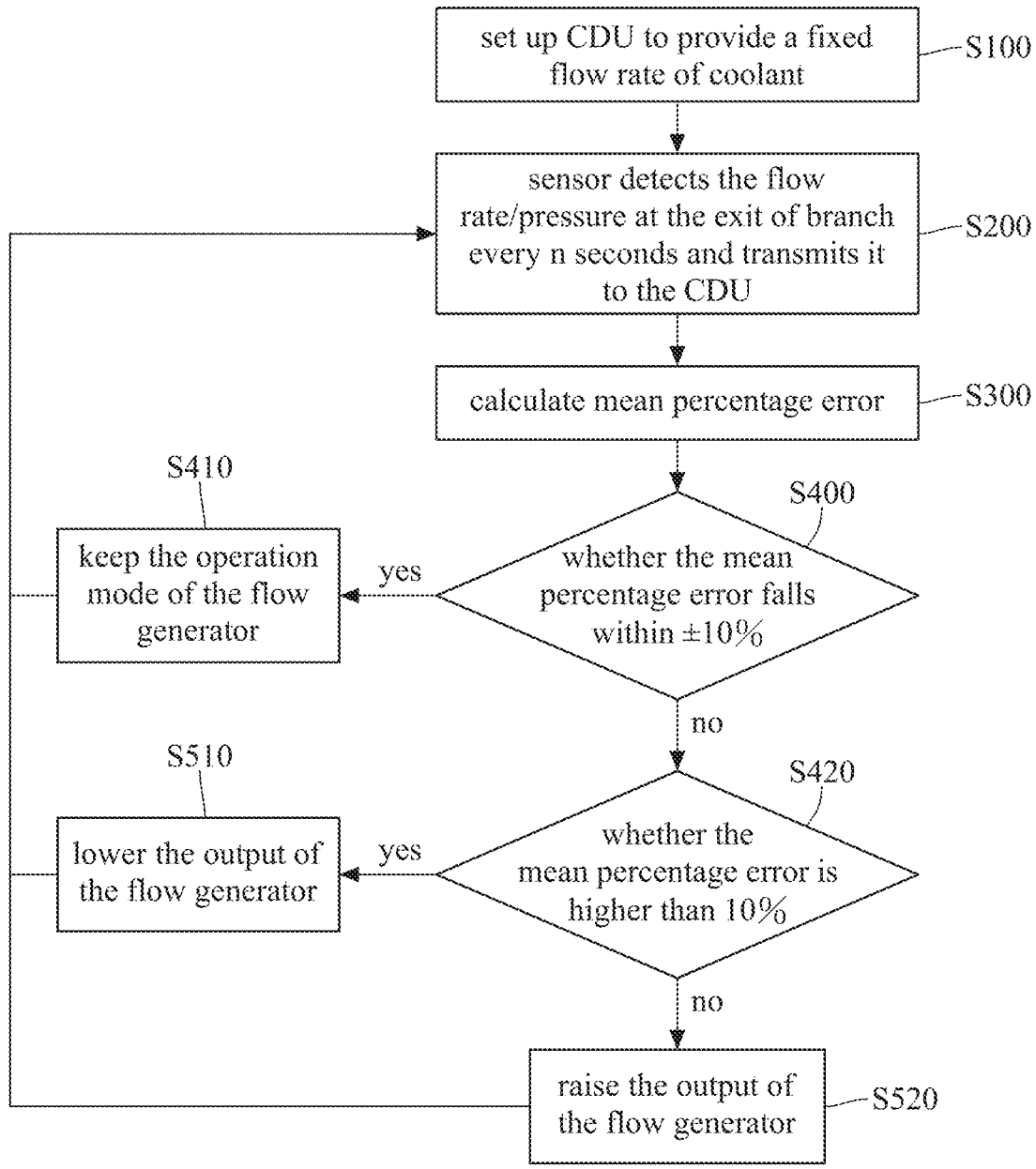
FIG. 10 illustrates control steps of an active coolant distribution device of one embodiment of the disclosure with a sensor.

In specific, referring to FIG. 10, there is shown a control procedure of the active coolant distribution device 1 with one or more sensors. Firstly, step S100 is to set up the CDU so as to provide the active coolant distribution device 1 with a coolant in a fixed flow rate, that is, it is allowed to preset a desired flow rate for the active coolant distribution device 1 using CDU, and the preset value of flow rate will be sent to the sensor for the later calculation of mean absolute percentage error.

Then, in step S200, the sensor detects the flow rate/pressure at the exit of branch B every n seconds and transmit the detected value to the CDU or the control center. The n seconds may be modified as required. Then or meanwhile, in step S300, the CDU or the control center can calculate a mean percentage error of the flow rate of which the sensor is located according to the received values and the value of the preset flow rate.

Then, in step S400, CDU determines whether the value of the mean percentage error falls within ±10%, in other words, CDU determines whether the mean absolute percentage error (MAPE) is under 10%. The threshold value (i.e., ±10%) is exemplary for the purpose of illustration and can be modified as required.

If yes, meaning that values of MAPE of the branches B are determined to be under 10%, step S410 is performed. Step S410 is to keep the operation mode of the flow generators 20, in other words, not changing the current operation mode or output setting of the flow generators 20. In the case that the flow generator 20 is a fan or a pump, the rotation speed of the flow generator 20 is fixed when the step S410 is performed. That is, when the MAPE of flow rate in the specific flow field is under 10%, the difference between the actual flow rate and the preset value is within an acceptable range so that there is no need to further change the operation mode (e.g., the rotation speed) of the flow generator 20 at this moment. Then, returning to step S200 to keep detecting the flow rate/pressure.

If no, meaning that values of MAPE of the branches B are determined to be higher than 10%, then step S420 is performed. Step S420 is to determine whether the mean percentage error is higher than 10%. If yes, meaning that the flow rate of the detected area is too high, then step S510 is performed. Step S510 is to lower the output of the flow generator 20 (e.g., lower the rotation speed) so as to lower the flow rate of the detected area. Step S200 is then performed after performing Step S510 in order to keep detecting the flow rate/pressure. If no, meaning that the MAPE of the flow rate of the detected area is neither within 10% nor too high, that is, the flow rate of the detected area is too low, then step S520 is performed. Step S520 is to raise the output of the flow generator 20 (e.g., raise the rotation speed) so as to increase the flow rate of the detected area. Then, step S200 is performed after performing Step S520 in order to keep detecting the flow rate/pressure.

Note that the step S420 can be modified to be determining whether the mean percentage error is lower than −10%; in this case, if yes, meaning that the flow rate of the detected area is determined to be too low, then step S520 is performed to raise the output of the flow generator 20 (e.g., raise the rotation speed) so as to increase the flow rate of the detected area; if no, meaning that the MAPE of the flow rate of the detected area is neither within 10% nor too low, that is, the flow rate of the detected area is too high, then step S510 is performed to lower the output of the flow generator 20 (e.g., lower the rotation speed) so as to lower the flow rate of the detected area.

According to the controlling steps of the active coolant distribution device 1 with sensor discussed above, the flow generators 20 are allowed to be adjusted in response to the actual condition of the flow field so that the flow generators 20 can provide required pressure in a dynamic manner to ensure a sufficient and proper amount of coolant for specific areas, thereby achieving a uniform distribution of coolant in the overall flow field.

Lastly, it is noted that the configuration of the second primary pipe in the previous embodiments is exemplary and not intended to limit the disclosure. For example, in other embodiments, the second primary pipe may omits the second branching pipe and the third branching pipe; in such a case, the branches are directly connected to the first liquid inlets of the first branching pipe, and the first liquid outlets of the first branching pipe are removed so that the coolant passing through the ejecting port will then flow toward the liquid outlet end along the second channel.

According to the active coolant distribution device and the electronic apparatus as discussed in the above embodiments of the disclosure, the placement of one or more flow generators between the first and second channels that are separated by the first and second inner wall portions make it possible to draw the coolant to flow to specific branches, and such an arrangement can compensate the pressure drop caused by frictional loss, local loss, and change in elevation. As a result, the flow rates of the branches are prevented from decreasing with the increase of the distance to the liquid inlet, thus achieving a uniform distribution of coolant of the flow field and ensuring a sufficient amount of coolant required for cooling each heat source.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. An active coolant distribution device, configured for circulating a coolant and accommodating at least one flow generator, comprising:
  a manifold, comprising a first primary pipe, a second primary pipe, and a plurality of branches connected to the first primary pipe and the second primary pipe; wherein at least one of the first primary pipe and the second primary pipe is suitable for accommodating the at least one flow generator; and
  the second primary pipe comprises:
    a first hollow post, having a plurality of first liquid inlets, wherein the plurality of first liquid inlets are arranged along a long side direction of the first hollow post and respectively connected to the plurality of branches; and
    a first inner wall portion and a second inner wall portion, arranged in the first hollow post, extending in the long side direction of the first hollow post, and spaced apart from each other so as to form a first channel, a second channel, and an accommodation space which are inside the first hollow post; wherein the accommodation space is located between the first channel and the second channel, the first inner wall portion has at least one converging port, the second inner wall portion has at least one ejecting port, the first channel is located between and connected to the plurality of first liquid inlets and the at least one converging port and is connected to the accommodation space via the at least one converging port, the at least one ejecting port is connected to and located between the accommodation space and the second channel.

2. The active coolant distribution device according to claim 1, wherein the accommodation space is configured to accommodate the at least one flow generator.

3. The active coolant distribution device according to claim 1, wherein the second primary pipe further comprises a second branching pipe and a third branching pipe, the first hollow post further has a plurality of first liquid outlets arranged along the long side direction of the first hollow post, the second branching pipe has a plurality of second liquid inlets and a plurality of second liquid outlets arranged along the long side direction and a third channel located between and connected to the plurality of second liquid inlets and the plurality of second liquid outlets, the third branching pipe has a plurality of third liquid inlets arranged along the long side direction and a fourth channel connected to the plurality of third liquid inlets, the plurality of branches are respectively directly connected to the plurality of second liquid inlets, the plurality of second liquid outlets are respectively directly connected to the plurality of first liquid inlets, the plurality of first liquid outlets are respectively directly connected to the plurality of third liquid inlets.

4. The active coolant distribution device according to claim 1, wherein the at least one flow generator is a fan or a pump.

5. The active coolant distribution device according to claim 1, wherein the manifold has an access side, a liquid inlet end, and a liquid outlet end, the liquid inlet end and the liquid outlet end are located at the access side and respectively located at the first primary pipe and the second primary pipe, the at least one flow generator corresponds to one of the plurality of branches that is located farthest away from the access side.

6. The active coolant distribution device according to claim 1, wherein the manifold has an access side, a liquid inlet end, and a liquid outlet end, the liquid inlet end and the liquid outlet end are located at the access side and respectively located at the first primary pipe and the second primary pipe, the at least one flow generator comprises a plurality of flow generators, L denotes a distance between one of the plurality of branches located farthest away from the access side and another one of the plurality of branches located closest to the access side, the plurality of flow generators are respectively distanced from the access side by $L/2n$, where n is an integer equal to or larger than 0.

7. An electronic apparatus, configured for circulating a coolant and accommodating at least one flow generator, comprising:
an enclosure; and
an active coolant distribution device, disposed on the enclosure, comprising:
a manifold, comprising a first primary pipe, a second primary pipe, and a plurality of branches connected to the first primary pipe and the second primary pipe;
wherein at least one of the first primary pipe and the second primary pipe is suitable for accommodating the at least one flow generator; and
wherein the second primary pipe comprises:
a first hollow post, having a plurality of first liquid inlets, wherein the plurality of first liquid inlets are arranged along a long side direction of the first hollow post and respectively connected to the plurality of branches; and
a first inner wall portion and a second inner wall portion, arranged in the first hollow post, extending in the long side direction of the first hollow post, and spaced apart from each other so as to form a first channel, a second channel, and an accommodation space which are inside the first hollow post; wherein the accommodation space is located between the first channel and the second channel, the first inner wall portion has at least one converging port, the second inner wall portion has at least one ejecting port, the first channel is located between and connected to the plurality of first liquid inlets and the at least one converging port and is connected to the accommodation space via the at least one converging port, the at least one ejecting port is connected to and located between the accommodation space and the second channel.

8. The electronic apparatus according to claim 7, wherein the accommodation space is configured to accommodate the at least one flow generator.

9. The electronic apparatus according to claim 7, wherein the second primary pipe further comprises a second branching pipe and a third branching pipe, the first hollow post further has a plurality of first liquid outlets, the second branching pipe further has a plurality of second liquid inlets, a plurality of second liquid outlets and a third channel located between and connected to the plurality of second liquid inlets and the plurality of second liquid outlets, the third branching pipe has a plurality of third liquid inlets and a fourth channel connected to the plurality of third liquid inlets, the plurality of branches respectively directly connected to the plurality of second liquid inlets, the plurality of second liquid outlets are respectively directly connected to the plurality of first liquid inlets, the plurality of first liquid outlets are respectively directly connected to the plurality of third liquid inlets.

10. The electronic apparatus according to claim 7, wherein the at least one flow generator is a fan or a pump.

11. The electronic apparatus according to claim 7, wherein the manifold has an access side, a liquid inlet end, and a liquid outlet end, the liquid inlet end and the liquid outlet end are located at the access side and respectively located at the first primary pipe and the second primary pipe, the at least one flow generator corresponds to one of the plurality of branches that is located farthest away from the access side.

12. The electronic apparatus according to claim 7, wherein the manifold has an access side, a liquid inlet end, and a liquid outlet end, the liquid inlet end and the liquid outlet end are located at the access side and respectively located at the first primary pipe and the second primary pipe, the at least one flow generator comprises a plurality of flow generators, L denotes a distance between one of the plurality of branches located farthest away from the access side and another one of the plurality of branches located closest to the access side, the plurality of flow generators are respectively distanced from the access side by $L/2n$, where n is an integer equal to or larger than 0.

13. An active coolant distribution device, configured for circulating a coolant, comprising:
a manifold, comprising a first primary pipe, a second primary pipe, and a plurality of branches connected to the first primary pipe and the second primary pipe;
wherein the second primary pipe comprises:
a first hollow post, having a plurality of first liquid inlets, wherein the plurality of first liquid inlets are arranged along a long side direction of the first hollow post and respectively connected to the plurality of branches; and
a first inner wall portion and a second inner wall portion, arranged in the first hollow post, extending in the long side direction of the first hollow post, and spaced apart from each other so as to form a first channel, a second channel, and an accommodation space which are inside the first hollow post; wherein the accommodation space is located between the first channel and the second channel, the first inner wall portion has at least one converging port, the second inner wall portion has at least one ejecting port, the first channel is located between and connected to the plurality of first liquid inlets and the at least one converging port and is connected to the accommodation space via the at least one converging port, the at least one ejecting port is connected to and located between the accommodation space and the second channel; and
at least one flow generator, being accommodated in at least one of the first primary pipe and the second primary pipe.

14. The active coolant distribution device according to claim 13, wherein the manifold has an access side, a liquid inlet end, and a liquid outlet end, the liquid inlet end and the liquid outlet end are located at the access side and respectively located at the first primary pipe and the second primary pipe, the at least one flow generator comprises a plurality of flow generators, L denotes a distance between one of the plurality of branches located farthest away from the access side and another one of the plurality of branches located closest to the access side, the plurality of flow generators are respectively distanced from the access side by $L/2n$, where n is an integer equal to or larger than 0.

15. The active coolant distribution device according to claim 13, wherein the accommodation space is configured to accommodate the at least one flow generator.

16. The active coolant distribution device according to claim 13, wherein the second primary pipe further comprises a second branching pipe and a third branching pipe, the first hollow post further has a plurality of first liquid outlets, the second branching pipe has a plurality of second liquid inlets, a plurality of second liquid outlets, and a third channel which is located between and connected to the plurality of second liquid inlets and the plurality of second liquid outlets, the third branching pipe has a plurality of third liquid inlets and a fourth channel connected to the plurality of third liquid inlets, the plurality of branches are respectively directly connected to the plurality of second liquid inlets, the plurality of second liquid outlets are respectively directly connected to the plurality of first liquid inlets, the plurality of first liquid outlets are respectively directly connected to the plurality of third liquid inlets.

17. The active coolant distribution device according to claim 13, wherein the manifold has an access side, a liquid inlet end, and a liquid outlet end, the liquid inlet end and the liquid outlet end are located at the access side and respectively located at the first primary pipe and the second primary pipe, the at least one flow generator corresponds to one of the plurality of branches that is located farthest away from the access side.

* * * * *